United States Patent
Lin et al.

(10) Patent No.: US 8,943,391 B2
(45) Date of Patent: Jan. 27, 2015

(54) CYCLIC CODE DECODING METHOD AND CYCLIC CODE DECODER

(75) Inventors: Yi-Min Lin, Taipei (TW); Chih-Hsiang Hsu, Kaohsiung (TW); Hsie-Chia Chang, Hsinchu (TW); Chen-Yi Lee, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 165 days.

(21) Appl. No.: 13/609,829

(22) Filed: Sep. 11, 2012

(65) Prior Publication Data

US 2013/0111304 A1 May 2, 2013

(30) Foreign Application Priority Data

Nov. 1, 2011 (TW) .............................. 100139777 A

(51) Int. Cl.
  *H03M 13/00* (2006.01)
  *H03M 13/15* (2006.01)
  *H03M 13/45* (2006.01)

(52) U.S. Cl.
  CPC ........ *H03M 13/152* (2013.01); *H03M 13/1525* (2013.01); *H03M 13/159* (2013.01); *H03M 13/451* (2013.01); *H03M 13/6502* (2013.01)
  USPC ....................................................... 714/785

(58) Field of Classification Search
  USPC ....................................................... 714/785
  See application file for complete search history.

(56) References Cited

U.S. PATENT DOCUMENTS

| 4,821,268 A | 4/1989 | Berlekamp | |
|---|---|---|---|
| 2003/0090945 A1* | 5/2003 | Kwon et al. | 365/200 |
| 2008/0104489 A1* | 5/2008 | Ito | 714/794 |
| 2010/0241933 A1* | 9/2010 | Latremouille | 714/785 |
| 2011/0107188 A1* | 5/2011 | Dror et al. | 714/773 |

OTHER PUBLICATIONS

Author: Keith Saints and Chris Heegard Title: Algebraic-Geometric Codes and Multidimensional Cyclic Codes: A Unified Theory and Algorithms or Decoding Using Grobner Bases Publisher and Date: IEEE Transactions on Information Theory, Vol. 41, No. 6, Nov. 1995.*
Zhang, High-speed VLSI Architecture for Low-complexity Chase Soft-decision Reed-Solomon Decoding, IEEE Inform. Theory and Application Workshop, pp. 422-430, Feb. 2009.

(Continued)

*Primary Examiner* — April Y Blair
*Assistant Examiner* — Thien D Nguyen
(74) *Attorney, Agent, or Firm* — Morgan, Lewis & Bockius LLP

(57) ABSTRACT

In a cyclic code decoding method, a decoder analyzes a received codeword to identify unreliable symbols in the codeword, and sets candidate syndrome patterns accordingly. Then, a syndrome calculator calculates evaluated syndrome values associated with one of the candidate syndrome patterns, and an error location polynomial (ELP) generator generates an ELP according to the syndrome values. An error correction device corrects the errors in the codeword according to the ELP when a degree of the ELP is not more than a threshold value, and the syndrome calculator adjusts the syndrome values and the ELP generator generates another ELP according to the adjusted syndrome values when otherwise.

12 Claims, 4 Drawing Sheets

(56) References Cited

OTHER PUBLICATIONS

Chase, A Class of Algorithms for Decoding Block Codes With Channel Measurement Information, IEEE Transactions of Information Theory, vol. 18, pp. 170-182, Jan. 1972.

Hsu et al., A 2.56 Gb/s Soft RS (255,239) Decoder Chip for Optical Communication Systems, Dept. of Electronics Engineering and Inst. of Electronics, ESSCIRC Conference Publication, Sep. 12-16, 2011, pp. 79-82.

* cited by examiner

CYCLIC CODE DECODING METHOD AND CYCLIC CODE DECODER

CROSS-REFERENCE TO RELATED APPLICATION

This application claims priority of Taiwanese Application No. 100139777, filed on Nov. 1, 2011.

BACKGROUND OF THE INVENTION

1. Field of the Invention

The present invention relates to a decoding method and a decoder, more particularly to a cyclic code decoding method and a cyclic code decoder.

2. Description of the Related Art

Generally, a cyclic code is sent out by a transmitting end through a channel, and is received by a receiving end as a received sequence. The cyclic code has a plurality of symbols in a form of hard information (i.e., digital information, such as an integer), and the received sequence has a plurality of elements in a form of soft information (i.e., analog information, such as a floating number). Then, a conventional decoding method based on Chase algorithm is implemented at the receiving end. For example, D. Chase introduced a conventional decoding method in "A Class of Algorithms for Decoding Block Codes with Channel Measurement Information," *IEEE Trans. Inform. Theory*, Vol. 18, No. 1, pages 170-182, Jan. 1972.

In the conventional decoding method, reliability of the elements of the received sequence is analyzed to obtain a plurality of evaluated codewords, and the evaluated codewords are decoded to obtain respective candidate codewords. Then, the candidate codewords are analyzed to determine one of those candidate codewords that is most similar to the received sequence, and said one of the candidate codewords is used as a decoded codeword of the received sequence. The Euclidean distance is commonly used to determine which one of the candidate codewords is most similar to the received sequence. However, since each of the elements of the received sequence is in a form of soft information and is expressed as a floating number, computations involved when determining the most similar one of the candidate codewords are complex.

In addition, a physical circuit for calculating an error location polynomial using Berlekamp-Massey algorithm or Euclidean algorithm is also complicated. Further, the conventional decoding method based on Chase algorithm requires a plurality of physical circuits for decoding the evaluated codewords to obtain the candidate codewords, respectively.

SUMMARY OF THE INVENTION

Therefore, an object of the present invention is to provide a cyclic code decoding method to be implemented using a cyclic code decoder requiring a relatively simple physical circuit for executing the cyclic code decoding method.

Accordingly, a cyclic code decoding method of this invention has an error correcting capability for correcting a maximum number of errors in a received codeword having a plurality of symbols. The cyclic code decoding method is to be implemented using a cyclic code decoder that includes a syndrome calculator, an error location polynomial generator, and an error correction device. The cyclic code decoding method comprises the following steps of:

a) configuring the cyclic code decoder to process the received codeword so as to identify unreliable ones of the symbols;

b) configuring the cyclic code decoder to set a group of candidate syndrome patterns according to the unreliable ones of the symbols;

c) configuring the syndrome calculator to calculate a number of evaluated syndrome values associated with one of the candidate syndrome patterns, the number of the evaluated syndrome values being twice the maximum number of the correctable errors;

d) configuring the error location polynomial generator to generate, according to the evaluated syndrome values, an error location polynomial with a degree not more than the maximum number of the correctable errors;

e) configuring the error location polynomial generator to determine whether the degree of the error location polynomial is greater than a threshold value less than the maximum number of the correctable errors;

f) when it is determined in step e) that the degree of the error location polynomial is greater than the threshold value, configuring the syndrome calculator to adjust the evaluated syndrome values so as to be associated with another one of the candidate syndrome patterns, and configuring the error location polynomial generator to repeat steps d) and e) with the evaluated syndrome values thus adjusted; and g) when it is determined in step e) that the degree of the error location polynomial is not greater than the threshold value, configuring the error correction device to correct the errors in the received codeword according to a root of the error location polynomial.

Another object of the present invention is to provide acyclic code decoder having a relatively simple circuit for implementing the cyclic code decoding method.

According to another aspect, a cyclic code decoder of this invention is capable of decoding a received codeword having a plurality of symbols, and has an error correcting capability for correcting a maximum number of errors in the received codeword. The cyclic code decoder comprises a reliability evaluator, a syndrome calculator, an error location polynomial generator, and an error correction device.

The reliability evaluator is operable to analyze the received codeword so as to identify unreliable ones of the symbols in the received codeword, and to seta group of candidate syndrome patterns according to the unreliable ones of the symbols. The syndrome calculator is operable to calculate a number of evaluated syndrome values associated with one of the candidate syndrome patterns, and the number of the evaluated syndrome values is twice the maximum number of the correctable errors. The error location polynomial generator is operable to generate, according to the evaluated syndrome values, an error location polynomial with a degree not more than the maximum number of the correctable errors, and to determine whether the degree of the error location polynomial is greater than a threshold value that is less than the maximum number of the correctable errors.

When the degree of the error location polynomial is not greater than the threshold value, the error correction device is operable to correct the errors in the received codeword according to a root of the error location polynomial . On the other hand, when the degree of the error location polynomial is greater than the threshold value, the syndrome calculator is further operable to adjust the evaluated syndrome values so as to be associated with another one of the candidate syndrome patterns, and the error location polynomial generator is further operable to generate another error location polynomial according to the evaluated syndrome values thus adjusted for use by the error correction device to correct the errors in the received codeword while a degree of said another error location polynomial is not greater than the threshold value.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
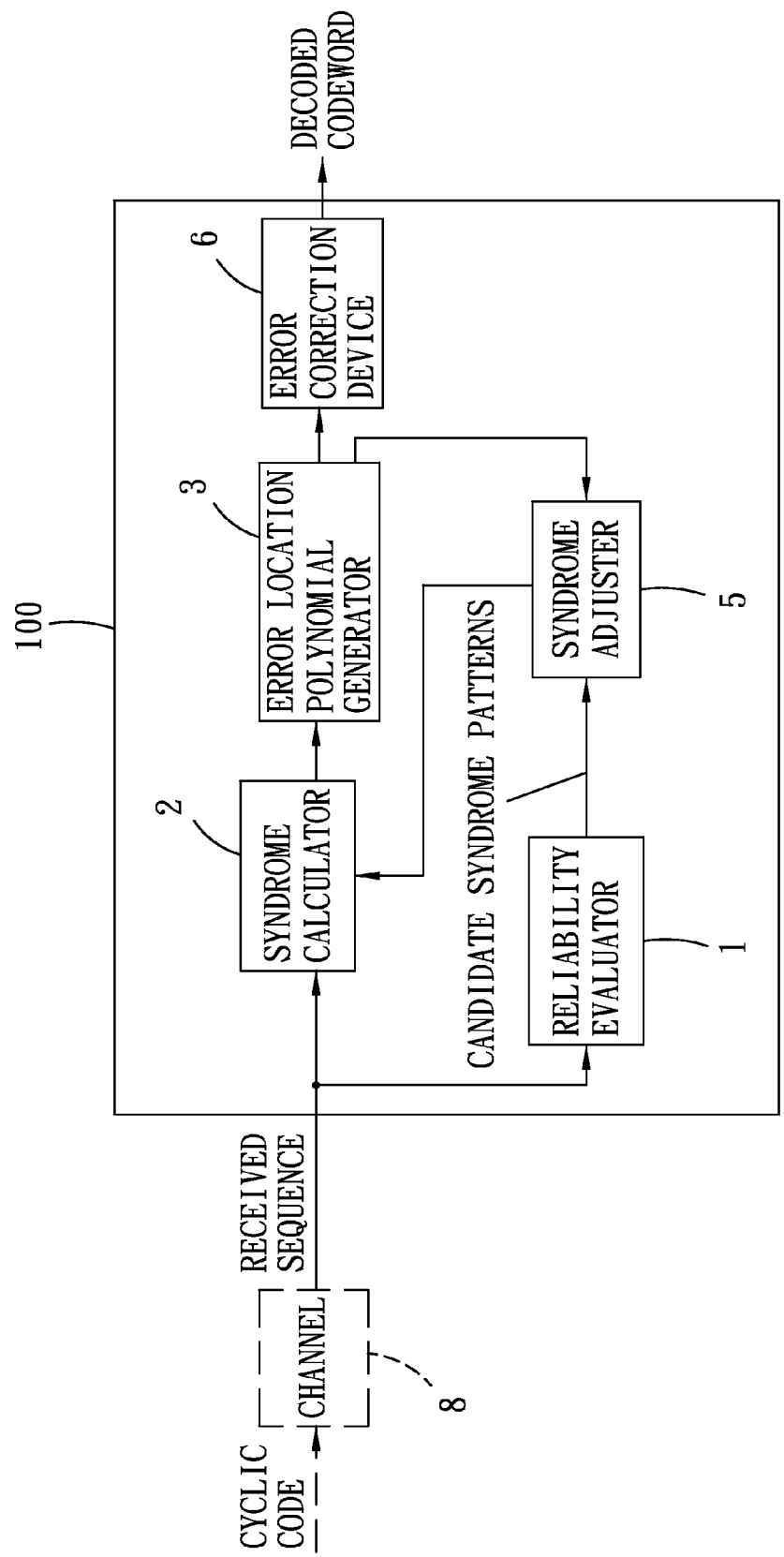
FIG. 1 is a block diagram of a first preferred embodiment of a cyclic code decoder according to this invention.

Before the present invention is described in greater detail, it should be noted that like elements are denoted by the same reference numerals throughout the disclosure.

Referring to FIG. 1, a cyclic code is transmitted through a channel 8 and is received by a first preferred embodiment of a cyclic code decoder 100 of this invention as a received sequence. The cyclic code decoder 100 is configured to locate and correct errors in the received sequence that are attributed to the channel 8 so as to obtain a decoded codeword approximating the cyclic code. In particular, the decoded codeword is digitally decoded from the received sequence. For example, the received sequence has a number (n) of elements each of which is soft information in an analog form (such as a floating number) and has a number (m≥1) of analog bits, and accordingly, the decoded codeword has a number (n) of symbols each of which corresponds to a respective one of the elements of the received sequence and has the number (m) of digital bits.

In this embodiment, the cyclic code decoder 100 includes a reliability evaluator 1, a syndrome calculator 2, an error location polynomial generator 3, a syndrome adjuster 5, and an error correction device 6. The reliability evaluator 1 and the syndrome calculator 2 are operable to receive the received sequence and to process the analog elements of the received sequence in a same manner so as to obtain a received codeword having the number (n) of symbols in a digital form. Further, the reliability evaluator 1 and the syndrome calculator 2 are also operable, in a same manner, to analyze the received codeword so as to identify least reliable ones of the symbols in the received codeword, and to set a group of candidate syndrome patterns according to the least reliable ones of the symbols. In particular, a number (q, 1<q<n) of least reliable symbols are selected from the symbols of the received codeword, and a number ($R=2^q$) of the candidate syndrome patterns are set. The syndrome calculator 2 is further operable to calculate a number (2t) of evaluated syndrome values associated with one of the candidate syndrome patterns, and the number (t) indicates an error correcting capability of the cyclic code decoder 100 for correcting a maximum number (t) of the errors in the received codeword. The error location polynomial generator 3 is operable to generate, according to the evaluated syndrome values, an error location polynomial with a degree not more than the maximum number (t) of the correctable errors, and to determine whether the degree of the error location polynomial is greater than a threshold value.

When the degree of the error location polynomial is not greater than the threshold value, the error correction device 6 is operable, according to the error location polynomial, to locate certain ones of the elements of the received sequence which are affected by interference from the channel 8 and to correct corresponding ones of the symbols of the received codeword that correspond respectively to said certain ones of the elements of the received sequence. When the degree of the error location polynomial is greater than the threshold value, the syndrome adjuster 5 is operable, according to another one of the candidate syndrome patterns, to compute a plurality of compensation values that correspond to the evaluated syndrome values, respectively. Accordingly, the syndrome calculator 2 is operable to adjust the evaluated syndrome values based upon the compensation values, respectively, and the error location polynomial generator 3 is further operable to generate another error location polynomial according to the evaluated syndrome values thus adjusted for use by the error correction device 6 to correct the errors in the received codeword while a degree of said another error location polynomial is not greater than the threshold value.

It is assumed that, in this embodiment, the cyclic code is coded as a Bose-Chaudhuri Hocquenghem (BCH) code and has the number (n=15) of digital symbols. It is well known to those skilled in the art that each of the symbols of the BCH code only has one bit (m=1), and therefore, each of the symbols of the BCH code is either 1 or 0. Accordingly, each of the elements of the received sequence is a single floating number (m=1), and each of the symbols of the received codeword and each of the symbols of the decoded codeword both have one bit (m=1).

Figure 2:
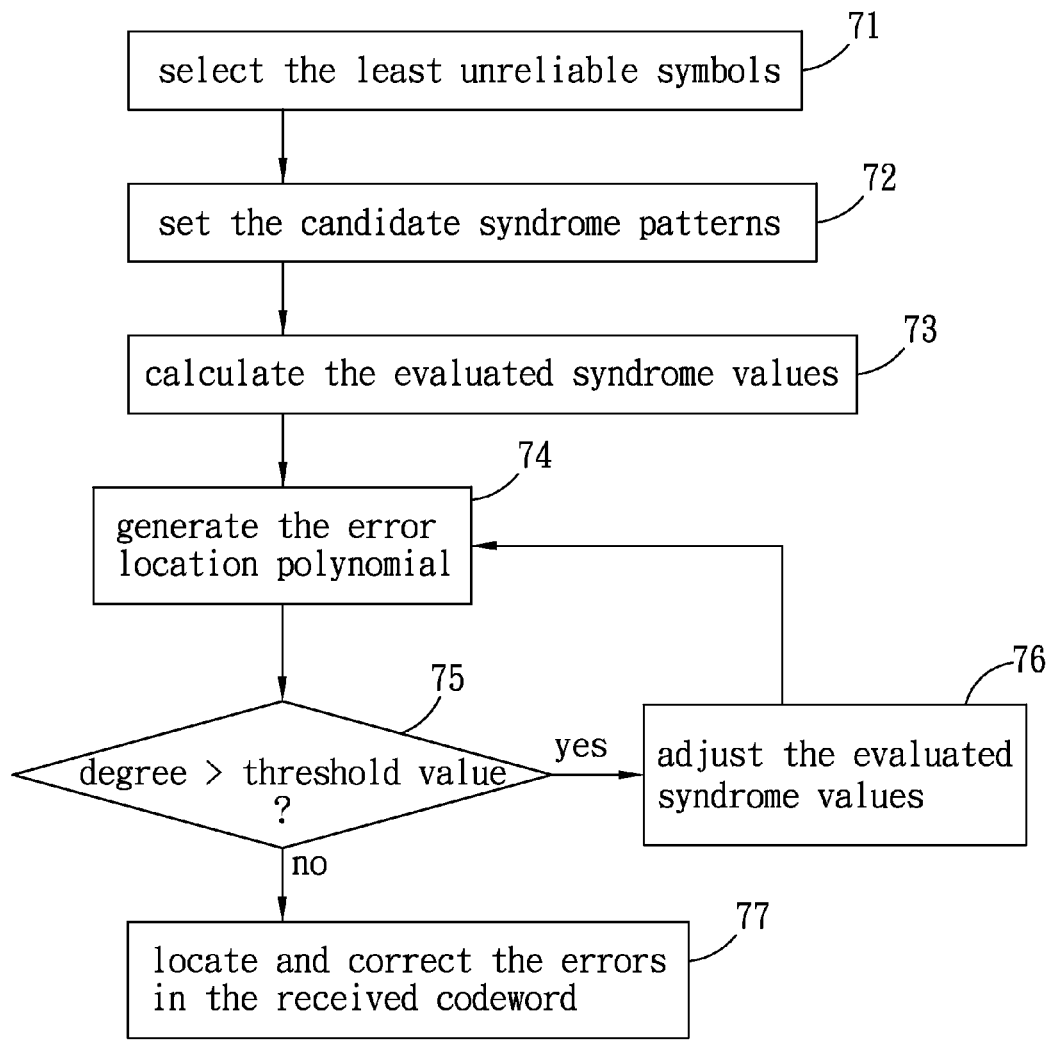
FIG. 2 is a flow chart of a cyclic code decoding method implemented by the cyclic code decoder.

Referring to FIGS. 1 and 2, the cyclic code decoder 100 is operable to implement a cyclic code decoding method including the following steps.

In step 71, the reliability evaluator 1 and the syndrome calculator 2 are operable, in the same manner, to process the analog elements of the received sequence so as to obtain the digital symbols of the received codeword, respectively. Subsequently, the reliability evaluator 1 and the syndrome calculator 2 are operable, in the same manner, to analyze the received codeword so as to select the number (q) of the least reliable symbols from the symbols of the received codeword. In this embodiment, for each of the analog bits of the received codeword, the reliability evaluator 1 and the syndrome calculator 2 are operable to use a log-likelihood ratio to determine a non-null probability of the analog bit to be analyzed being a digital bit of 1 and a null probability of the analog bit to be analyzed being a digital bit of 0, and to identify one of the digital bits as unreliable when a corresponding one of the analog bits has the non-null probability equal to the null probability. The procedure for determining the reliability may be different in other embodiments, and is not limited to the disclosure of this embodiment. In other embodiments, the reliability evaluator 1 and the syndrome calculator 2 may be operable to select the number (q) of relatively unreliable symbols from the symbols of the received codeword instead of the least reliable symbols.

In step 72, the reliability evaluator 1 and the syndrome calculator 2 are operable to set the number ($R=2^q$) of the candidate syndrome patterns according to the least reliable symbols selected in step 71. For example, three of the symbols of the received codeword are selected as the least reliable symbols, and there will be 8 sets ($R=2^3$) of the candidate syndrome patterns, i. e., {0,0,0}, {0,0,1}, {0,1,0}, {0,1,1}, {1,0,0}, {1,0,1}, {1,1,0}, and {1,1,1}.

In step 73, the syndrome calculator 2 is operable to calculate the number (2t) of the evaluated syndrome values associated with one of the candidate syndrome patterns. For example, the received codeword having the number (n=15) of the symbols is expressed as a received polynomial $P(x)=r_0+$ $r_1 \cdot x + r_2 \cdot x^2 + r_3 \cdot x^3 + \ldots + r_{14} \cdot x^{14}$, where $r_0, r_1, r_2, r_3, \ldots, r_{14}$ are the symbols of the received codeword. The syndrome calculator 2 is operable to substitute the number (2t) of non-zero elements of Galois Field into the received polynomial so as to obtain the evaluated syndrome values corresponding to the non-zero elements, respectively.

In step 74, the error location polynomial generator 3 is operable, according to the evaluated syndrome values, to generate the error location polynomial with the degree not more than the maximum number (t) of the correctable errors. Then, in step 75, the error location polynomial generator 3 is further operable to determine whether the degree of the error location polynomial is greater than the threshold value. The flow goes to step 76 when it is determined that the degree of the error location polynomial is greater than the threshold value, and goes to step 77 when otherwise.

Generally, the degree of the error location polynomial is equal to a number of roots of the error location polynomial, and the roots can be used to locate locations of the errors in the received sequence. However, when the received sequence has a number of errors more than (t), the number of the roots of the error location polynomial with the degree of (t) is usually less than (t) and even the roots of the error location polynomial may not be found. Therefore, the threshold value is preferably less than the maximum number (t) of the correctable errors, and is equal to (t−1) in this embodiment. In other embodiments, the threshold value may be less than (t−1) according to environment of the channel 8.

In step 76, the syndrome adjuster 5 is operable, according to another one of the candidate syndrome patterns, to compute a plurality of compensation values that correspond respectively to the evaluated syndrome values, and then, syndrome calculator 2 is operable to adjust the evaluated syndrome values based upon the respective compensation values. Afterwards, the error location polynomial generator 3 is operable to repeat steps 74 and 75 to generate another error location polynomial according to the evaluated syndrome values adjusted in step 76. For example, the syndrome adjuster is configured to select a particular one of the candidate syndrome patterns used for computing the compensation values according to a binary code or a Gray code. It is assumed that $\{0,1,0\}$ is one of the candidate syndrome patterns that is associated with the evaluated syndrome values used in step 74, and, in step 76, $\{0,1,1\}$, $\{1,0,0\}$, $\{1,0,1\}$, . . . can be respectively selected in sequence according to the binary code, or $\{1,1,0\}$, $\{1,1,1\}$, $\{1,0,1\}$, . . . can be respectively selected in sequence according to the Gray code where two successive values differ in only one bit.

In particular, when a number $\eta$ of the symbols $r_0, r_1, r_2, \ldots r_{(n-1)}$ are the least reliable symbols $r_{L\_\eta}$ ($\eta$ ranging from 0 to (n−1)), the syndrome adjuster 5 is operable to compute each of the compensation values based upon $$\{s_2(L\_1) \cdot \alpha^{L-1} + s_2(L\_2) \cdot \alpha^{L-2} + \ldots + s_2(L\_\eta) \cdot \alpha^{L-\eta}\} - \{s_1(L\_1) \cdot \alpha^{L-1} + s_i(L\_2) \cdot \alpha^{L-2} + \ldots + s_1(L\_\eta) \cdot \alpha^{L-\eta}\}$$

where $\alpha$ is a corresponding one of the non-zero elements of Galois Field, $\{s_1(L\_1), s_1(L\_2), \ldots, s_1(L\_\eta)\}$ is one of the candidate syndrome patterns that is associated with the evaluated syndrome values used in step 74 to generate the error location polynomial, and $\{s_2(L\_1), s_2(L\_2), \ldots, s_2(L\_\eta)\}$ is another one of the candidate syndrome patterns that is selected in step 76 to compute the compensation values. For instance, if $r_2$, $r_5$ and $r_8$ are the least reliable symbols and the candidate syndrome values of the least reliable symbols are changed from $\{0,1,0\}$ to $\{0,1,1\}$, the compensation value of a corresponding one of the evaluated syndrome values is equal to $\{0 \cdot \alpha^2 + 1 \cdot \alpha^5 + 1 \cdot \alpha^8\} - \{0 \cdot \alpha^2 + 1 \cdot \alpha^5 + 0 \cdot \alpha^8\}$.

In step 77, the error correction device 6 is operable to locate and correct the errors in the received codeword according to the error location polynomial so as to obtain the decoded codeword. In particular, the error correction device 6 is operable to solve the roots of the error location polynomial for locating said certain ones of the elements of the received sequence which are affected by interference from the channel 8, and to correct the corresponding ones of the symbols of the received codeword that correspond respectively to said certain ones of the elements of the received sequence in location. For the BCH code in this embodiment, since each of the symbols of the received codeword is either 1 or 0, error correction of the corresponding ones of the symbols is to invert the symbols.

It should be appreciated that the cyclic code decoder 100 of this embodiment is not only applicable to the BCH code but also to other kinds of cyclic codes, such as Reed-Solomon (RS) code. In the case of the RS code, each of the symbols of the received codeword may have more than one bit (m>1), and may have a number ($2^m$) of possible values. Therefore, the error correction device 6 is further operable to obtain an error evaluation polynomial that corresponds to the error location polynomial and that is used to calculate error values for correcting the symbols of the received codeword.

Figure 3:
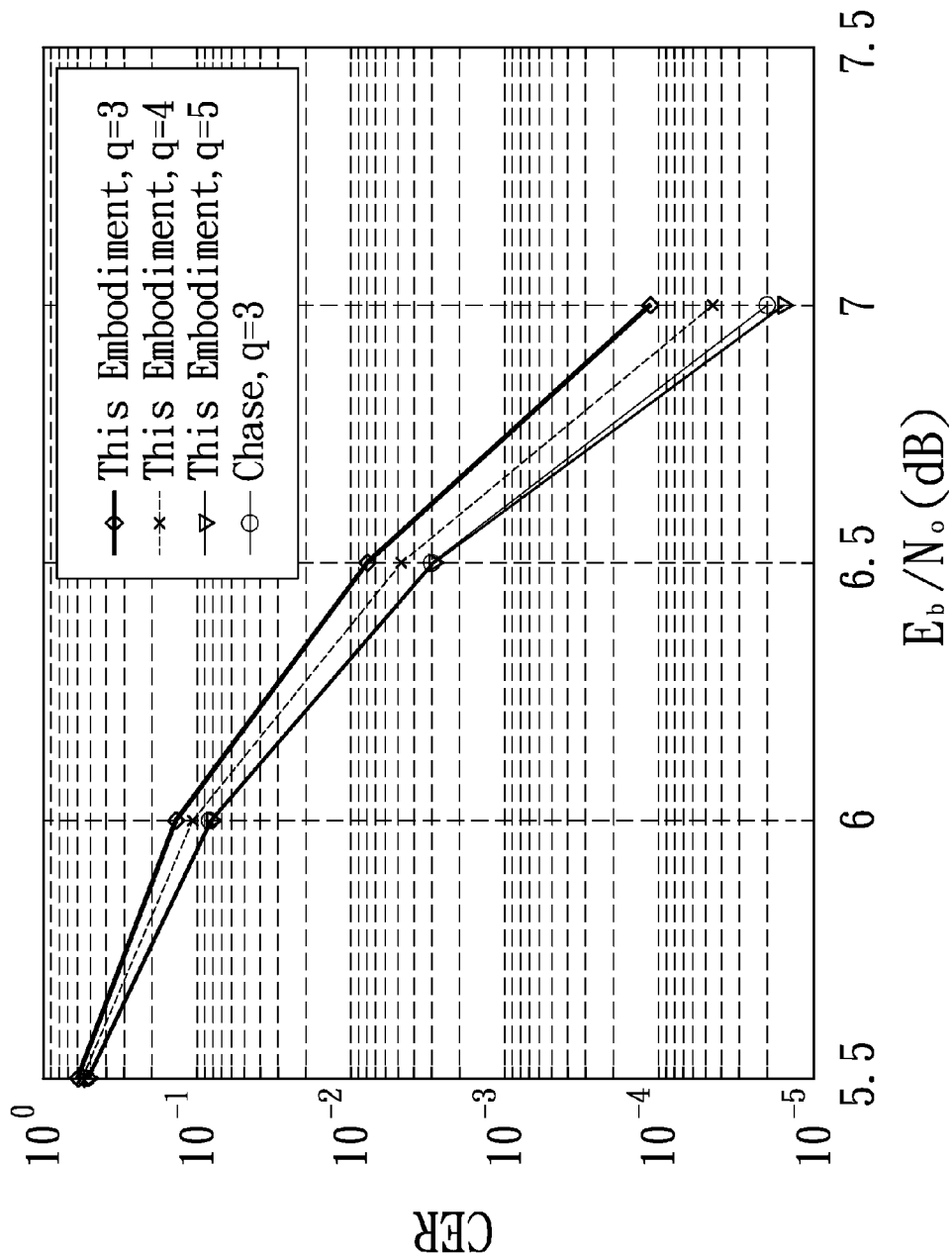
FIG. 3 is a plot illustrating performance of the cyclic code decoder of the first preferred embodiment.

FIG. 3 is a plot illustrating codeword error rates (CER) of the decoded codeword obtained using the cyclic code decoding method of this embodiment and a conventional decoding method based on Chase algorithm. In this simulation, the cyclic code is a RS code (255, 239) having the number (n=255) of code symbols created from a number (k=239) of source symbols (i.e., data symbols). It can be seen from FIG. 3 that the CERs are decreased with the number (q) of the least reliable symbols under the same energy per bit to noise power spectral density ratio ($E_b/N_o$). The CER of the decoded codeword obtained with five of the least reliable symbols (q=5) using the cyclic code decoding method of this embodiment is approximate to the CER of the decoded codeword obtained with three of the least reliable symbols (q=3) using the conventional decoding method. However, as shown in Table 1, computation load of the cyclic code decoding method of this embodiment is significantly lower than that of the conventional decoding method.

TABLE 1

| | This Embodiment (q = 5) | | | Chase Algorithm (q = 3) | | |
|---|---|---|---|---|---|---|
| $E_b/N_o$ | 6.0 | 6.5 | 7.0 | 6.0 | 6.5 | 7.0 |
| Average Number of Times for Computing the Evaluated Syndrome Values | 5.22 | 1.30 | 1.07 | 8 | 8 | 8 |
| Average Number of Times for Computing the Error Location Polynomial | 5.22 | 1.30 | 1.07 | 8 | 8 | 8 |
| Average Number of Times for Searching the Error Locations | 5.22 | 1.30 | 1.07 | 8 | 8 | 8 |
| Average Number of Times for Correcting the Error | 5.22 | 1.30 | 1.07 | 8 | 8 | 8 |

The following Table 2 gives an example of hardware costs of physical circuits for implementing the cyclic code decoding method of this embodiment and the interpolation-based decoding method according to Chase algorithm, respectively. It can be seen from Table 2 that a number of logical gates (e.g., multiplier, adder, etc.) of the physical circuits for the cyclic code decoding method of this embodiment is less than that for the interpolation-based decoding method. The information of the physical circuit for the conventional decoding method in Table 2 is obtained according to the teaching of X. Zhang in "High-speed VLSI Architecture for Low-complexity Chase Soft-decision Reed-Solomon Decoding," *IEEE Inform. Theory and Application Workshop,* pages 422-430, February 2009. In particular, the number of the logical gates of the physical circuits for the interpolation-based decoding method in Table 2 has not considered logical gates for calculation of Euclidean distance in Chase algorithm. Thus, in fact, practical physical circuits for the interpolation-based decoding method may be relatively complex.

TABLE 2

|  | Constant Multiplier | Variable Multiplier | Adder | Multiplexer | ROM | RAM | Register | Latency |
|---|---|---|---|---|---|---|---|---|
| This Embodiment | 32 | 68 | 85 | 984 | 520 | 256 × 3 | 834 | 259 |
| Chase Algorithm | 8 | 66 | 108 | 1109 | 1024 | 68 + 256 × 8 | 1606 | 528 |

Figure 4:
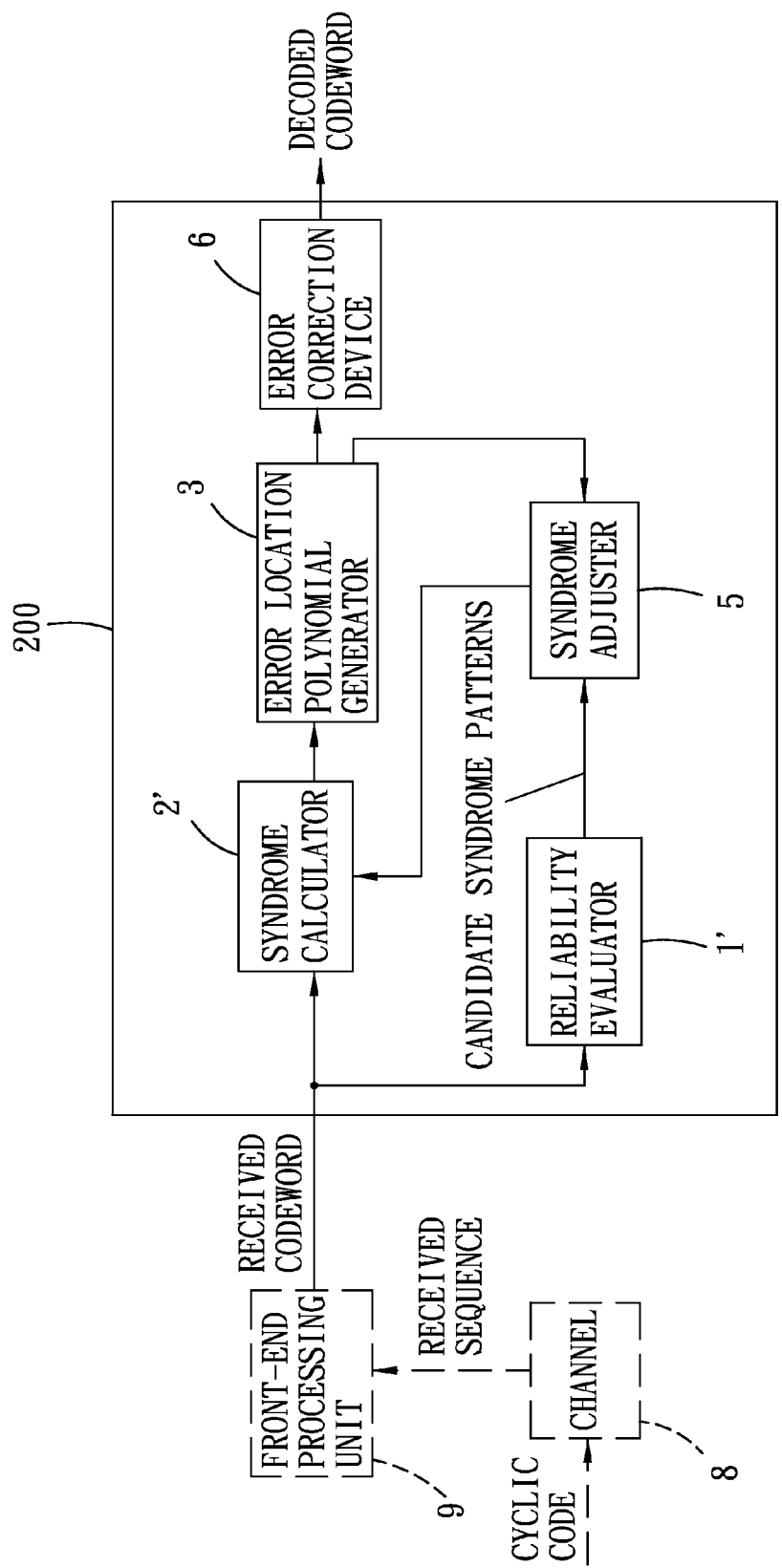
FIG. 4 is a block diagram of a second preferred embodiment of a cyclic code decoder according to this invention.

Referring to FIG. 4, a second preferred embodiment of a cyclic code decoder 200 of this invention is shown to be similar to the first preferred embodiment, and is configured to be connected to a front-end processing unit 9. The front-end processing unit 9 is connected between the channel 8 and the cyclic code decoder 200, and is operable to receive and to process the analog elements of the received sequence so as to output the received codeword to the cyclic code decoder 200. The front-end processing unit 9 is further operable to output a notification signal to the cyclic code decoder 200 to notify the cyclic code decoder 200 of which ones of the symbols are unreliable. Thus, in this embodiment, the reliability evaluator 1' and the syndrome calculator 2' of the cyclic code decoder 200 are not needed to implement step 71, and are operable to set the candidate syndrome patterns according to the notification signal from the front-end processing unit 9.

To sum up, the cyclic code decoder 100, 200 does not need to compute syndrome values corresponding to all the candidate syndrome patterns, respectively, but is capable of adjusting the evaluated syndrome values so as to generate another error location polynomial that corresponds to another one of the candidate syndrome patterns. Further, the cyclic code decoder 100, 200 is configured to solve an error location polynomial when a degree of this error location polynomial is not greater than the threshold value, and is not configured to use the Euclidean distance for obtaining the decoded codeword. Thus, the physical circuits of the cyclic code decoder 100, 200 are relatively simple, and the hardware cost of the physical circuits of the cyclic code decoder 100, 200 is relatively reduced.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A cyclic code decoding method having an error correcting capability for correcting a maximum number of correctable errors in a received codeword that has a plurality of symbols, said cyclic code decoding method to be implemented using a cyclic code decoder that includes a syndrome calculator, an error location polynomial generator, and an error correction device, and comprising the following steps of:

a) configuring the cyclic code decoder to analyze the received codeword so as to identify unreliable ones of the symbols;

b) configuring the cyclic code decoder to set a group of candidate syndrome patterns according to the unreliable ones of the symbols;

c) configuring the syndrome calculator to calculate a number of evaluated syndrome values according to the received codeword and one of the candidate syndrome patterns, the number of the evaluated syndrome values being twice the maximum number of the correctable errors;

d) configuring the error location polynomial generator to generate, according to the evaluated syndrome values, an error location polynomial with a degree not more than the maximum number of the correctable errors;

e) configuring the error location polynomial generator to determine whether the degree of the error location polynomial is greater than a threshold value, which is less than the maximum number of the correctable errors;

f) when it is determined in step e) that the degree of the error location polynomial is greater than the threshold value, configuring the syndrome calculator to adjust the evaluated syndrome values so as to be associated with another one of the candidate syndrome patterns, and configuring the error location polynomial generator to repeat steps d) and e) with the evaluated syndrome values thus adjusted; and g) when it is determined in step e) that the degree of the error location polynomial is not greater than the threshold value, configuring the error correction device to correct the correctable errors in the received codeword according to a root of the error location polynomial.

2. The cyclic code decoding method as claimed in claim 1, wherein:

in step a), the cyclic code decoder is configured to identify a number q of least reliable ones of the symbols of the received codeword, q >1; and in step b), the cyclic code decoder is configured to set a number $2^g$ of the candidate syndrome patterns.

3. The cyclic code decoding method as claimed in claim 1, the cyclic code decoder further including a syndrome adjuster, wherein, in step f), the syndrome adjuster is configured to compute a plurality of compensation values according to said another one of the candidate syndrome patterns, and the syndrome calculator is configured to adjust the evaluated syndrome values based upon the compensation values, respectively.

4. The cyclic code decoding method as claimed in claim 3, the received codeword having a number n of symbols $r_0$, $r_1$, $r_2, \ldots r(_{n-1})$ with a number η of the unreliable symbols $r_{L_{-\eta}}$, η ranging from 0 to (n−1), wherein the evaluated syndrome values correspond to a plurality of non-zero elements of Galois Field, respectively;

wherein, in step f), the syndrome adjuster is configured to compute each of the compensation values based upon $$\{s_2(L\_1) \cdot \alpha^{L-1} + s_2(L\_2) \cdot \alpha^{L-2} + \ldots + s_2(L\_\eta) \cdot \alpha^{L-\eta}\} - \{s_1(L\_1) \cdot \alpha^{L-1} + s_i(L\_2) \cdot \alpha^{L-2} + \ldots + s_1(L\_\eta) \cdot \alpha^{L-\eta}\},$$

where $\alpha$ is a corresponding one of the non-zero elements, $L\_\eta$ represents a position of the unreliable symbol in the received codeword, $\{s_1(L\_1), s_1(L\_2), \ldots, s_1(L\_\eta)\}$ is one of the candidate syndrome patterns that is associated with the evaluated syndrome values used in step d) to generate the error location polynomial, and $\{s_2(L\_1), s_2(L\_2), \ldots, s_2(L\_\eta)\}$ is one of the candidate syndrome patterns that is associated with the evaluated syndrome values adjusted in step f).

5. The cyclic code decoding method as claimed in claim 1, wherein, in step f), the syndrome calculator is configured to adjust the evaluated syndrome values to be associated with a particular one of the candidate syndrome patterns that is selected according to one of a binary code and a Gray code.

6. The cyclic code decoding method as claimed in claim 1, further comprising, before step a), the steps of:
configuring the cyclic code decoder to receive and process a received sequence having a plurality of elements so as to obtain the symbols of the received codeword that correspond respectively to the elements of the received sequence, each of the elements of the received sequence having a number m of analog bits, each of the symbols of the received codeword having a number m of digital bits, $m \geq 1$;
for each of the analog bits, configuring the cyclic code decoder to use a log-likelihood ratio to determine a non-null probability of the analog bit to be analyzed being a digital bit of 1 and a null probability of the analog bit to be analyzed being a digital bit of 0; and
configuring the cyclic code decoder to identify one of the digital bits as unreliable when a corresponding one of the analog bits has the non-null probability equal to the null probability.

7. A cyclic code decoder capable of decoding a received codeword that has a plurality of symbols and having an error correcting capability for correcting a maximum number of correctable errors in the received codeword, said cyclic code decoder comprising:
a reliability evaluator operable to analyze the received codeword so as to identify unreliable ones of the symbols in the received codeword, and to set a group of candidate syndrome patterns according to the unreliable ones of the symbols;
a syndrome calculator operable to calculate a number of evaluated syndrome values according to the received codeword and one of the candidate syndrome patterns, the number of the evaluated syndrome values being twice the maximum number of the correctable errors;
an error location polynomial generator operable to generate, according to the evaluated syndrome values, an error location polynomial with a degree not more than the maximum number of the correctable errors, and to determine whether the degree of the error location polynomial is greater than a threshold value, which is less than the maximum number of the correctable errors; and
an error correction device operable to correct the errors in the received codeword according to a root of the error location polynomial when the degree of the error location polynomial is not greater than the threshold value;
wherein, when the degree of the error location polynomial is greater than the threshold value, said syndrome calculator is further operable to adjust the evaluated syndrome values so as to be associated with another one of the candidate syndrome patterns, and said error location polynomial generator is further operable to generate another error location polynomial according to the evaluated syndrome values thus adjusted for use by said error correction device to correct the correctable errors in the received codeword while a degree of said another error location polynomial is not greater than the threshold value.

8. The cyclic code decoder as claimed in claim 7, wherein said reliability evaluator is operable to identify a number q of least reliable ones of the symbols of the received codeword and to set a number $2^q$ of the candidate syndrome patterns, $q > 1$.

9. The cyclic code decoder as claimed in claim 7, further comprising a syndrome adjuster operable to compute a plurality of compensation values according to said another one of the candidate syndrome patterns,
wherein said syndrome calculator is operable to adjust the evaluated syndrome values based upon the compensation values, respectively.

10. The cyclic code decoder as claimed in claim 9, the received codeword having a number n of symbols $r_0, r_1, r_2, \ldots r_{(n-1)}$ with a number $\eta$ of the unreliable symbols $r_{L\_\eta}$ ranging from 0 to (n-1), wherein:
the evaluated syndrome values calculated by said syndrome calculator correspond to a plurality of non-zero elements of Galois Field, respectively; and
said syndrome adjuster is operable to compute each of the compensation values based upon $$\{s_2(L\_1) \cdot \alpha^{L-1} + s_2(L\_2) \cdot \alpha^{L-2} + \ldots + s_2(L\_\eta) \cdot \alpha^{L-\eta}\} - \{s_1(L\_1) \cdot \alpha^{L-1} + s_i(L\_2) \cdot \alpha^{L-2} + \ldots + s_1(L\_\eta) \cdot \alpha^{L-\eta}\},$$

where $\alpha$ is a corresponding one of the non-zero elements, $L\_\eta$ represents a position of the unreliable symbol in the received codeword, $\{s_1(L\_1), s_1(L\_2), \ldots, s_1(L\_\eta),\}$ is one of the candidate syndrome patterns that is associated with the evaluated syndrome values used to generate the error location polynomial, and $\{s_2(L\_1), s_2(L\_2), \ldots, s_2(L\_\eta)\}$ is one of the candidate syndrome patterns that is associated with the evaluated syndrome values used to generate said another error location polynomial.

11. The cyclic code decoder as claimed in claim 7, wherein said syndrome calculator is operable to adjust the evaluated syndrome values to be associated with a particular one of the candidate syndrome patterns that is selected according to one of a binary code and a Gray code.

12. The cyclic code decoder as claimed in claim 7, wherein said reliability evaluator is further operable to:
receive and process a received sequence having a plurality of elements so as to obtain the symbols of the received codeword that correspond respectively to the elements of the received sequence, each of the elements of the received sequence having a number m of analog bits, each of the symbols of the received codeword having a number m of digital bits, $m \geq 1$;
for each of the analog bits, use a log-likelihood ratio to determine a non-null probability of the analog bit to be analyzed being a digital bit of 1 and a null probability of the analog bit to be analyzed being a digital bit of 0; and
identify one of the digital bits as unreliable when a corresponding one of the analog bits has the non-null probability equal to the null probability.

* * * * *